United States Patent [19]

Shier et al.

[11] Patent Number: 4,959,697
[45] Date of Patent: Sep. 25, 1990

[54] SHORT CHANNEL JUNCTION FIELD EFFECT TRANSISTOR

[75] Inventors: John S. Shier, Apple Valley; Matthew F. Schmidt, Bloomington, both of Minn.

[73] Assignee: VTC Incorporated, Bloomington, Minn.

[21] Appl. No.: 481,803

[22] Filed: Feb. 20, 1990

Related U.S. Application Data

[63] Continuation of Ser. No. 221,524, Jul. 20, 1988, abandoned.

[51] Int. Cl.⁵ .............................................. H01L 29/80
[52] U.S. Cl. .......................................... 357/22; 357/91
[58] Field of Search ...................... 357/22 R, 22 F, 91

[56] References Cited

U.S. PATENT DOCUMENTS

| | | | |
|---|---|---|---|
| 3,268,374 | 8/1966 | Anderson | 148/175 |
| 3,372,316 | 3/1968 | Teszner | 317/235 |
| 3,767,982 | 10/1973 | Teszner et al. | 317/235 |
| 4,176,368 | 11/1979 | Compton | 357/22 |
| 4,412,238 | 10/1983 | Khadder et al. | 357/43 |
| 4,549,193 | 10/1985 | Malhi et al. | 357/22 |
| 4,586,239 | 5/1986 | Briere | 29/578 |

Primary Examiner—Andrew J. James
Assistant Examiner—Mark Prenty
Attorney, Agent, or Firm—Kinney & Lange

[57] ABSTRACT

A junction field effect transistor fabricated by a simplified process for incorporation into an integrated circuit including bipolar transistors is disclosed. The JFET comprises an isolated gate region of a first conductivity type with a surface on the integrated circuit and a buried layer beneath the surface to enhance conductivity. A pair of spaced-apart regions of a second conductivity type extend into the gate region form the surface but not into contact with the buried layer. A plurality of ion implanted subsurface channels of the second conductivity type extend between the pair of spaced-apart regions. Between each subsurface channel and the surface is an upper gate region of the first conductivity type, each of which has an enhanced dopant concentration compared with adjacent portions of the gate region. The upper gates are formed through the same mask as the subsurface channels for insuring optimal alignment of the gates with the channels and simplifying fabrication. The resulting JFET also has improved frequency response characteristics.

2 Claims, 5 Drawing Sheets

SHORT CHANNEL JUNCTION FIELD EFFECT TRANSISTOR

This is a continuation of application Ser. No. 07/221,524 filed on July 20, 1988, abandoned as of the date of this application.

BACKGROUND OF THE INVENTION

1. Field of the Invention.

The invention relates to junction field effect transistors and more particularly junction field effect transistors suitable for integration with bipolar transistors into integrated circuits.

2. Description of the Prior Art.

Junction field effect transistor ("JFET") structures suitable for use in monolithic integrated circuits are known in the art. Integrated circuits incorporating both bipolar junction transistors and JFETs have highly desirable characteristics, and accordingly processes have been developed which are compatible with the fabrication of both types of devices in a single integrated circuit. Preferably, these processes involve a minimum number of dopant diffusion and implantation steps.

Minimization of the number of steps in a process has typically involved using a particular diffusion or implantation step to simultaneously form structures required in each device. A bipolar junction transistor has base, emitter and collector regions. A JFET has gate, channel, source and drain regions. Frequently, a JFET is a symmetric device and the drain and source regions are indistinguishable until connected into a circuit. Where the base region of the bipolar device is of a like conductivity type with the source/drain regions of the JFET, all three regions can be produced in a single diffusion or implantation step.

Location of various diffused or implanted regions in an integrated circuit is controlled by exposing only selected portions of the surface of the semiconductor material to diffusion or ion implantation by well known processes. Masks are used to control exposure of photoresist layers laid over the surface of the semiconductor to actinic radiation. After development of the photoresist layer exposes the desired portions of the semiconductor surface, the appropriate diffusion or implantation step is taken. Each implantation step involves a number of substeps.

It is also desirable to achieve a device of a minimum size. Benefits which accrue with size reduction include faster devices and the ability to put more devices into a given area on the semiconductor die. As described above, there are four regions generic to JFETs. Minimization of the size of the overall device depends on reduction in the size of these regions. However, a number of factors come into play when a given region is reduced in size.

Reference to U.S. Pat. No. 4,176,368 by Compton highlights certain of these factors. Compton teaches a p channel JFET suitable for incorporation with bipolar transistors in an integrated circuit. A JFET gate region comprises a portion of a lightly doped n conductivity type epitaxial layer isolated within a p type region over a substrate. The gate region also includes a highly conductive buried layer underlying active regions of the device to enhance gate conductivity. Two symmetric, diffused moderately doped p type regions are provided at spaced apart intervals over the buried layer within the gate region to provide a source and a drain. The source/drain diffusion is compatible with formation of base regions for npn bipolar transistors elsewhere on the device surface.

Compton provides a single lightly doped p type subsurface channel for connecting the diffused source and drain regions. The transconductance requirements of the JFET are met by varying the width of the channel. Between the subsurface channel and the surface of the semiconductor device are implanted subregions of the gate region including a moderately doped n type cap and a heavily doped n type top gate. The top gate overlaps the lateral bounds of the channel to provide a low resistance electrical path from the pn junction between the top gate and the channel to the buried layer. The moderately doped caps space the top gate from the source and drain regions to avoid creation of a pn junction between these relatively heavily doped regions which would be characterized by a low reverse breakdown voltage.

A gate electrode in Compton's device is attached to a heavily doped n type diffusion region, which provides a low resistance connection between an electrode and the gate region. Operation of the JFET is conventional, a voltage is applied to the gate region by the gate electrode to reverse bias the pn junctions between the gate region and the source, drain and particularly the channel regions. As the reverse bias voltage is increased, depletion regions adjacent the pn junctions expand, eventually cutting off the channel region beneath the top gate. Doping of the top gate is selected so that a space charge region develops under reverse bias voltage into the channel primarily from its junction with the top gate. To provide a reasonably high speed device, the current path through the top gate to the gate electrode must be highly conductive. Notwithstanding high conductivity, frequency response of the Compton device in A.C. operation is affected by the distance the gate current must travel. Charge taken from or transmitted to the space charge region adjacent the top gate passes laterally across the width of the top gate. The charge travels between the highly conductive buried layer and the top gate around the lateral bounds of the channel. The heavily doped region adjacent the gate electrode provides a low resistance path for the gate charge. A space charge region also develops under reverse bias adjacent the deeper junction between the gate and the channel. Charge moves directly between this junction and the buried layer under reverse biasing. The lower space charge region which develops provides a relatively small part of the total pinch-off effect.

Several disadvantages are associated with the Compton device. The top gate must be made highly conductive to compensate for delays introduced because of its width. The wider the top gate is made, to allow for higher transconductance JFETs, the more heavily doped the top gate must be to maintain a given response speed. Fabrication of a bounded top gate is also a complicated process requiring three separate maskings of the device to produce the channel, the cap and the top gate.

SUMMARY OF THE INVENTION

The present invention provides an integrable JFET with an upper gate which is simpler to fabricate than devices taught by the prior art. The disclosed junction field effect transistor is formed in an n conductivity type gate region formed within a p type well. A heavily doped n type buried layer is disposed beneath the surface of the isolated gate region to enhance conductivity of the gate region. A pair of spaced-apart p type regions extend partway into the gate region from the surface thereof. The spaced-apart regions are connected by a plurality of subsurface p type channels. Above the channels, between each channel and the surface of the semiconductor device, is an n type upper gate region, which is somewhat more heavily doped than the adjacent portions of the gate region. Frequency response of the JFET is enhanced by providing a plurality of channels. Because gate current drawn from the channels through the upper gate regions can pass through the space between channels, the dopant concentration of the upper gate region can be reduced. The upper gate regions accordingly need not be insulated from the heavily doped p type source and drain regions. Additionally, the upper gates are formed through the same mask as the subsurface channels insuring optimal alignment of the gates with the channels and allowing elimination of two maskings of the device during manufacture.

DETAILED DESCRIPTION OF THE PREFERRED EMBODIMENTS

Figure 1A:
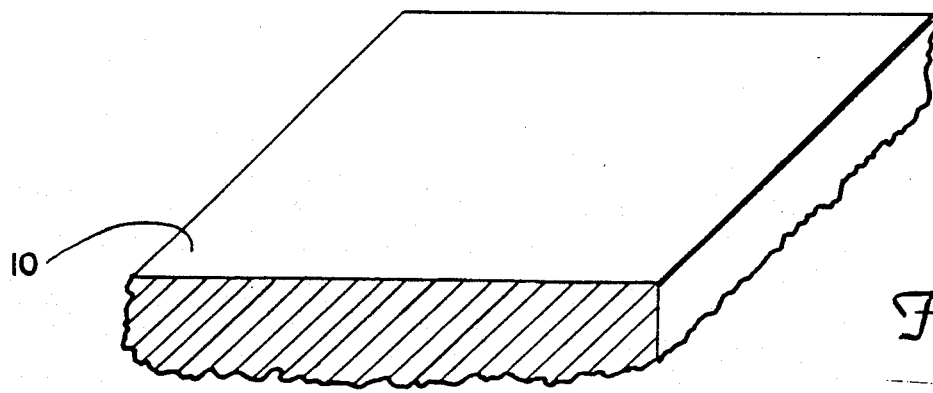
FIGS. 1A through 1H depict formation of the various conductivity regions of the inventive junction field effect transistor.

The JFET of the present invention is described with reference to a p channel device. The invention can of course be embodied in an n channel device. FIG. 1A illustrates a portion of a p conductivity type substrate 10, typically boron doped silicon, suitable for use in fabrication of integrated circuits incorporating p channel JFETs of the present invention. Integrated circuits incorporating the JFET of the present invention include both bipolar junction transistors and JFETs.

Figure 1B:
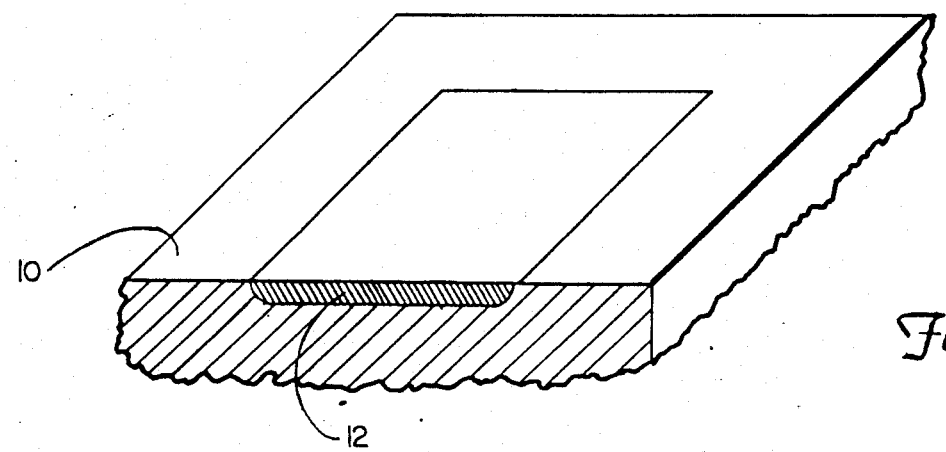

FIG. 1B illustrates formation of an n type buried layer 12 into substrate 10 from the surface thereof. Buried layer 12 is a diffused, heavily doped layer and is sized to underlie the primary active regions of a single semiconductor device, herein the short channel JFET of the present invention.

Figure 1C:
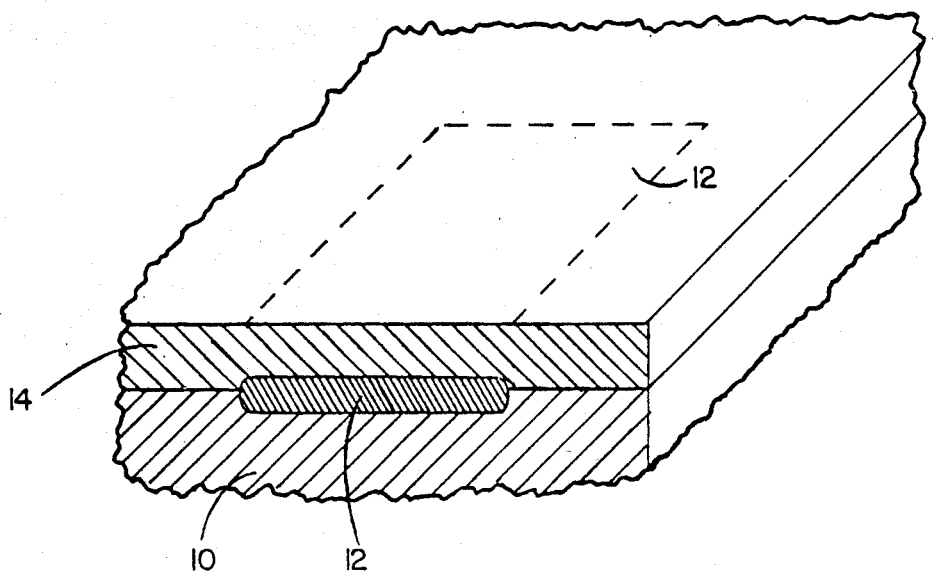

FIG. 1C illustrates growth of an n type lightly doped epitaxial layer 14 over the surface of substrate 10. Buried layer 12 diffuses upward into epitaxial layer 14 after formation of the epitaxial layer.

Figure 1D:
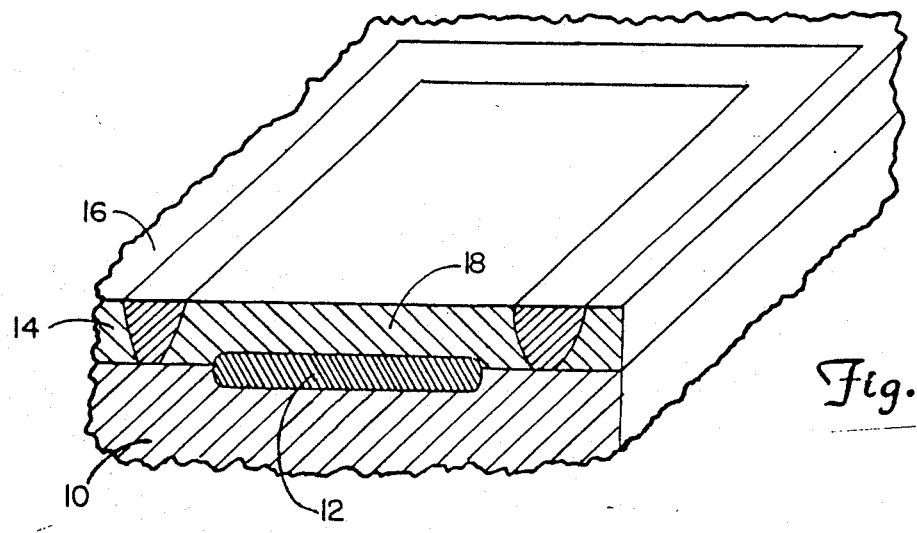

FIG. 1D illustrates diffusion of a heavily doped p type isolating region 16 into and through epitaxial layer 14 into contact with substrate 10, isolating a gate region 18 over buried layer 12. Gate region 18 is an otherwise unmodified portion of n type epitaxial layer 14.

Figure 1E:
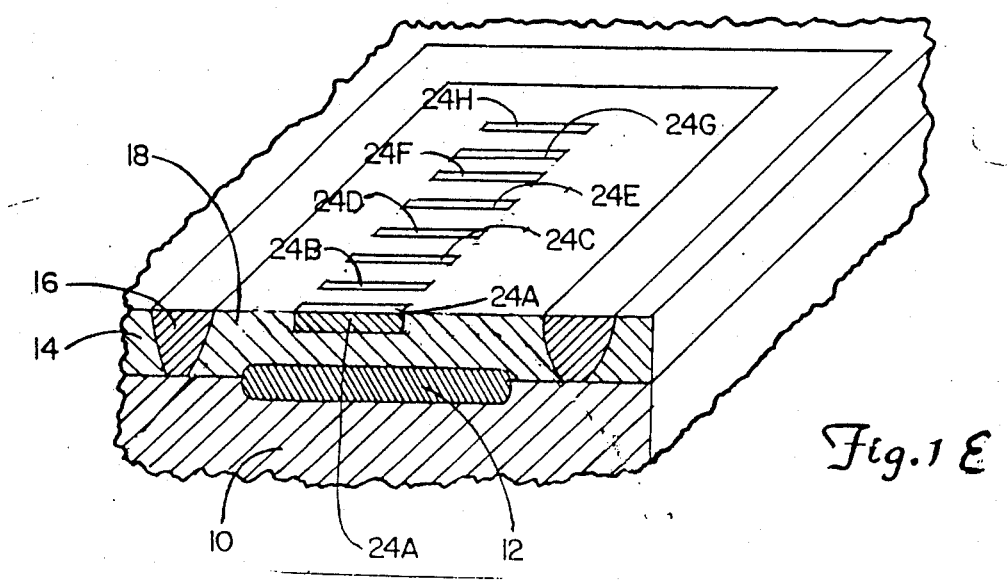

FIG 1E illustrates ion implantation of a plurality of p conductivity type subsurface channels 24A through 24H. Depictions of the mask and development of the photoresist layer have been omitted because such steps are well known in the art. The dopant used for the channel implantation is boron. Implantation is done at sufficiently energized level to center dopant concentration below the surface.

Figure 1F:
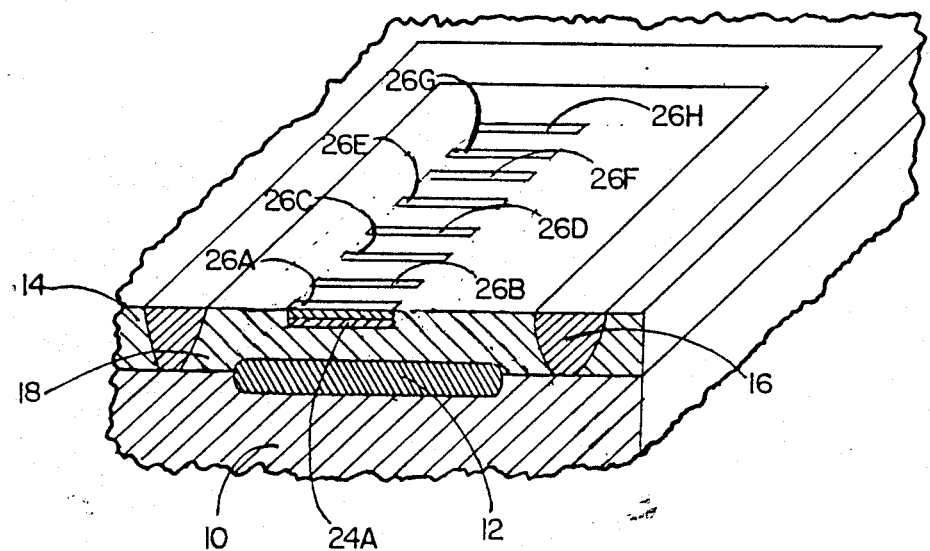

Without removing the photoresist layer described in the reference to FIG. 1E, a phosphorus implantation of n type upper gate regions 26A-H is made as illustrated in FIG. 1F. This results in formation of a plurality of upper gate regions 26A-H directly adjacent and immediately above each subsurface channel regions 24A-H, respectively. Upper gates 26A-H are spaced one from another by unmodified gate region 18. Phosphorus is preferred because of its relatively high diffusion rates compared with boron. Use of phosphorus ensures sufficient lateral diffusion to overcome any trace boron doped region extending upward from channels 24A-H to the surface of epitaxial layer 14.

Figure 1G:
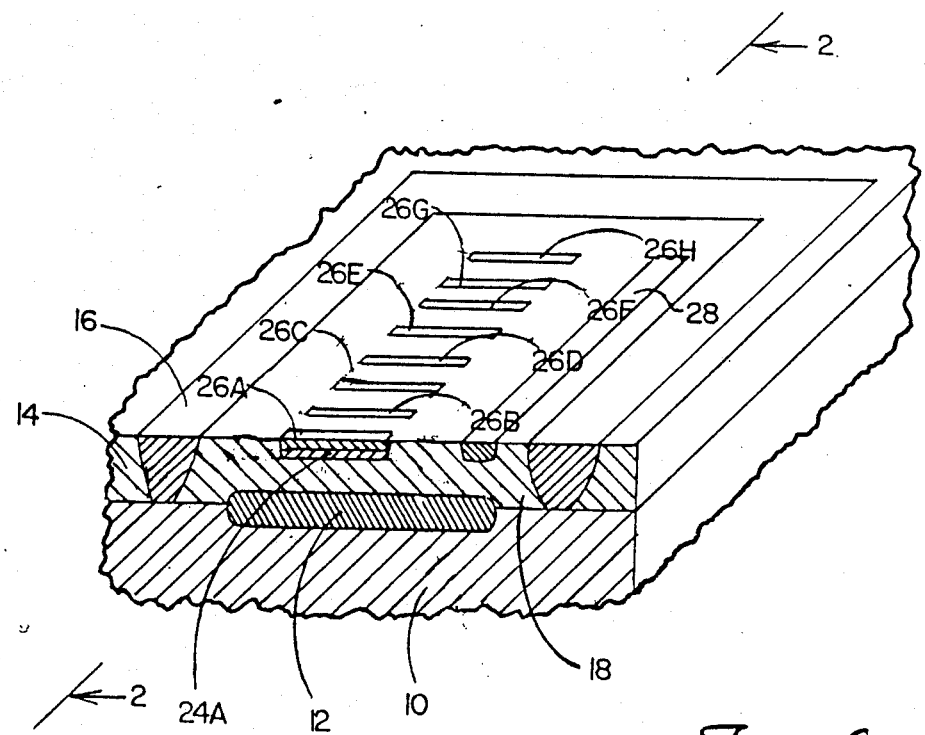

FIG. 1G illustrates ion implantation of an n type gate contact region 28 into gate region 18. Contact region 28 allows attachment of a gate electrode to gate region 18 at a point removed from the gap between source 20 and drain 22. Removal of the gate electrode from between source 20 and drain 22 allows spacing between the source and drain to be determined without allowance for space sufficient to attach a gate electrode between the source and the drain. Gate contact region 28 is formed at the same time as the emitter implants are made elsewhere on the die.

Figure 1H:
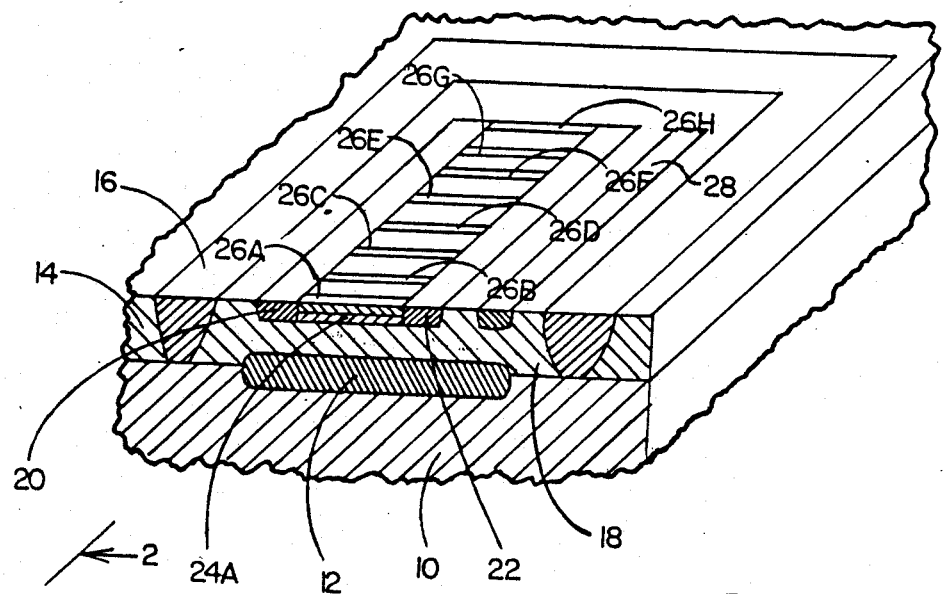

FIG. 1H illustrates the ion implantation of two spaced-apart p type source and drain regions 20 and 22 at opposite ends of channels 24A-H. Regions 20 and 22 are symmetric, moderately doped regions and their designation as source and drain respectively is somewhat arbitrary. Typically, region 20 will provide the source region of the junction field effect transistor and region 22 will provide the drain region. Source 20 and drain 22 are spaced by gate region 18 from buried layer 12 to avoid formation of a low reverse voltage breakdown pn junction between the source or the drain and buried layer 12. Source 20 and drain 22 are formed during implantation of the extrinsic base regions of npn bipolar transistors (not shown) on other parts of the semiconductor die. Subsurface channels 24A through 24H overlap source 20 and drain 22 slightly providing an electrical connection between source 20 and drain 22. The slight overlap obviates need for perfect alignment of channels 24 with source 20 and drain 22.

Figure 2:
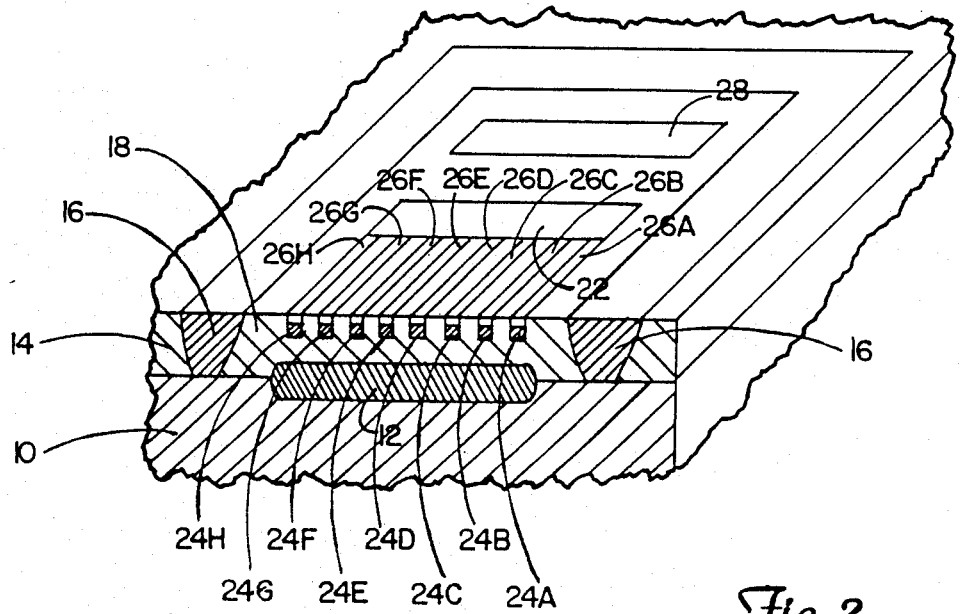
FIG. 2 is a combined cross section and surface elevational view of the JFET of the invention along section 2—2 of FIG. 1H.

FIG. 2 illustrates areas of unmodified gate region 18 between channels 24A-24H. Source to drain current is transmitted through channels 24A-24H absent reverse bias applied to gate region 18. As a reverse bias is applied to gate region 18, a space charge region forms, primarily from the upper boundaries of channels 24A-24H. As the reverse voltage increases, the space-charge region in channels 24A-24H expands from the pn junction between the channels and upper gates 26A-26H, and to a lesser extent from the lower boundary between the channels and gate 18. In A.C. operation, gate region 18 between channels 24A-H supports transmission of the gate current to buried layer 12.

Gate current passes between the gaps between channels 26A-26H and around the outer channels 26A-26H to buried layer 12. Buried layer 12 conducts the current to a point near contact region 28. Gate current in D.C. operation is negligible.

Figure 3:
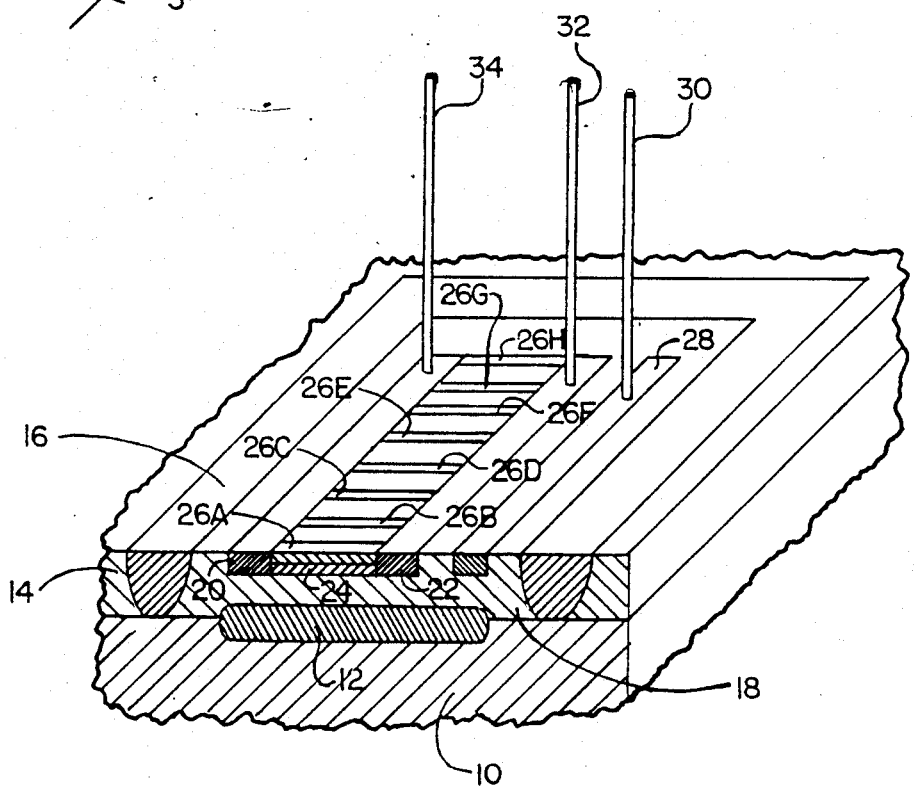
FIG. 3 is a combined cross section and surface elevational view of the JFET of the invention viewed along section 3—3 of FIG. 2.

FIG. 3 illustrates in schematic form connection of source electrode 34 to source 20, drain electrode 32 to drain 22 and gate electrode 30 to contact region 28. Depiction of oxide layers for insulating and protecting the device has been omitted for the sake of clarity.

The JFET of the present invention provides for shorter subsurface channels than the prior art by reducing the complexity of the upper gate regions over the channels. Elimination of an upper gate contact, or, alternatively, graded conductivity regions, and division of the channel into a plurality of channels permits channel length reduction. The multiple channels further permit a reduction in the conductivity of the upper gate without loss of switching time. Collecting the improvements provide a higher speed device.

Although the present invention has been described with reference to preferred embodiments, workers skilled in the art will recognize that changes may be made in form and detail without departing from the spirit and scope of the invention.

What is claimed is:

1. A rapid switching junction field effect transistor incorporated into a first conductivity type epitaxial layer of an integrated circuit, the junction field effect transistor comprising:
    a gate region formed from an electrically isolated portion of the epitaxial layer and having a surface thereon;
    a pair of spaced-apart regions of a second conductivity type extending into the gate region from the surface thereof;
    a plurality of subsurface channels of the second conductivity type extending between the pair of spaced-apart regions of the second conductivity type, the subsurface channels being spaced from each other by segments of the first conductivity type gate region;
    a plurality of upper gate regions of an enhanced first conductivity type, each upper gate region being located between a subsurface channel and the surface wherein each upper gate region is vertically aligned with and adjacent its respective subsurface channel;
    a diode junction between each upper gate region and its respective subsurface channel;
    an enhanced first conductivity type gate contact region extending from the surface of the gate region into a region of the gate region at an area laterally spaced from the pair of spaced-apart regions of the second conductivity type and the upper gate regions; and
    a buried layer of an enhanced first conductivity type underlying the plurality of subsurface channels and the enhanced first conductivity type gate contact region;
    electrodes connected to the pair of spaced-apart regions and to the gate contact region to define a source, a drain and a gate; and
    a primary electrical conduction path located between the subsurface channels and the gate contact region through the plurality of upper gate regions, through the segments of the gate region substantially adjacent the subsurface channels and the gate region to the buried layer and through the buried layer and the gate region to the enhanced gate contact region, wherein extension of space charge depletion zones into the subsurface channels occurs primarily from the diode junction between the subsurface channels and the upper gate regions upon application of an appropriate electrical potential to the gate contact region.

2. The junction field effect transistor of claim 1 wherein the regions of the first conductivity type are n type conductivity regions and the regions of the second conductivity type are p type conductivity regions.

* * * * *